United States Patent
Wang et al.

(10) Patent No.: US 7,548,095 B1
(45) Date of Patent: Jun. 16, 2009

(54) ISOLATION SCHEME FOR STATIC AND DYNAMIC FPGA PARTIAL PROGRAMMING

(75) Inventors: Zhigang Wang, Sunnyvale, CA (US); Fethi Dhaoui, Patterson, CA (US); Santosh Yachareni, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/022,921

(22) Filed: Jan. 30, 2008

(51) Int. Cl.
G06F 7/38 (2006.01)
H03K 19/177 (2006.01)
(52) U.S. Cl. .............................. 326/101; 326/40; 326/47
(58) Field of Classification Search ................... None
See application file for complete search history.

(56) References Cited

U.S. PATENT DOCUMENTS

2008/0175060 A1* 7/2008 Liu et al. ............... 365/185.18
2008/0283896 A1* 11/2008 Noguchi et al. ............. 257/315

* cited by examiner

*Primary Examiner*—Anh Q Tran
(74) *Attorney, Agent, or Firm*—Lewis and Roca LLP

(57) ABSTRACT

An isolation scheme to permit partial programming of FPGA integrated circuits controlled by Flash memory cells includes a p-type semiconductor region. First and second spaced apart deep n-wells are disposed in the p-type semiconductor region. First and second p-wells are respectively disposed in the first and second deep n-wells. First and second segments of Flash memory are disposed in the in first and second p-wells. N-type regions are disposed in each deep n-well between the outer boundary of the p-wells and the outer boundary of the deep n-wells.

8 Claims, 2 Drawing Sheets

US 7,548,095 B1

ISOLATION SCHEME FOR STATIC AND DYNAMIC FPGA PARTIAL PROGRAMMING

BACKGROUND OF THE INVENTION

1. Field of the Invention

The present invention relates to integrated circuits in general and to programmable integrated circuits such as FPGA integrated circuits. More particularly, the present invention relates to isolation schemes to permit partial programming of FPGA integrated circuits controlled by Flash memory cells.

2. The Prior Art

FPGA integrated circuits employing Flash memory cells as the programming mechanism are known in the art. Such integrated circuits employ pass transistor or pass gates controlled by Flash memory cells to implement the programmable connections that define the functions and interconnectivity of the circuits.

In many instances, it would be advantageous to be able to partially program the Flash memory contained in Flash-based FPGA integrated circuits. It is difficult to accomplish this in prior-art Flash-based FPGA integrated circuits because Flash memory erase operations are usually done globally since all memory cells share the same well. Performing partial erase while part of the non-volatile memory is operating is challenging because, among other reasons, sensitivity to substrate noise of the sensing circuitry of the non-volatile memory configuration. In particular, sense amplifiers are susceptible to substrate noise.

BRIEF DESCRIPTION OF THE INVENTION

An isolation scheme to permit partial programming of FPGA integrated circuits controlled by Flash memory cells includes a p-type semiconductor region. First and second spaced apart deep n-wells are disposed in the p-type semiconductor region. First and second p-wells are respectively disposed in the first and second deep n-wells. First and second segments of Flash memory are disposed in the in first and second p-wells. N-type regions are disposed in each deep n-well between the outer boundary of the p-wells and the outer boundary of the deep n-wells.

According to a first aspect of the present invention, a first segment of Flash memory is disposed in a first p-well disposed in a first deep n-well in a p-type semiconductor substrate or well. A second segment of Flash memory is disposed in a second p-well in the semiconductor substrate. The second p-well is disposed in a second deep n-well in the substrate that is spaced apart from the first deep n-well. An n-type region is disposed in each deep n-well between the outer boundary of the p-well containing the Flash memory segment and the outer boundary of the deep n-well. The n-type region has a dopant concentration higher than that of the deep n-well. A p-type region having a dopant concentration higher than that of the p-type substrate or well is disposed between the deep n-wells.

According to a second aspect of the present invention, a first segment of Flash memory is disposed in a first p-well in a semiconductor substrate disposed in a first deep n-well in the substrate. A second segment of Flash memory is disposed in a second p-well in the semiconductor substrate. The second p-well is disposed in a second deep n-well in the substrate that is spaced apart from the first deep n-well. An n-type region is disposed in each deep n-well between the outer boundary of the p-well containing the Flash memory segment and the outer boundary of the deep n-well. The n-type region has a dopant concentration higher than that of the deep n-well.

According to a third aspect of the present invention, a first segment of Flash memory is disposed in a first p-well in a semiconductor substrate disposed in a first deep n-well in the substrate. A second segment of Flash memory is disposed in a second p-well in the semiconductor substrate. The second p-well is disposed in a second deep n-well in the substrate that is spaced apart from the first deep n-well. An n-type region is disposed in each deep n-well between the outer boundary of the p-well containing the Flash memory segment and the outer boundary of the deep n-well. The n-type region has a dopant concentration higher than that of the deep n-well. An isolation n-well is disposed in the p-type substrate or well at a location between and separated from the deep n-wells. An n-type region is disposed in the isolation n-well and has a dopant concentration higher than that of the isolation n-well.

According to a fourth aspect of the present invention, a first segment of Flash memory is disposed in a first p-well disposed in a first deep n-well in a high-resistance p-type or native silicon semiconductor substrate. A second segment of Flash memory is disposed in a second p-well in the semiconductor substrate. The second p-well is disposed in a second deep n-well in the substrate that is spaced apart from the first deep n-well. An n-type region is disposed in each deep n-well between the outer boundary of the p-well containing the Flash memory segment and the outer boundary of the deep n-well. The n-type region has a dopant concentration higher than that of the deep n-well.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
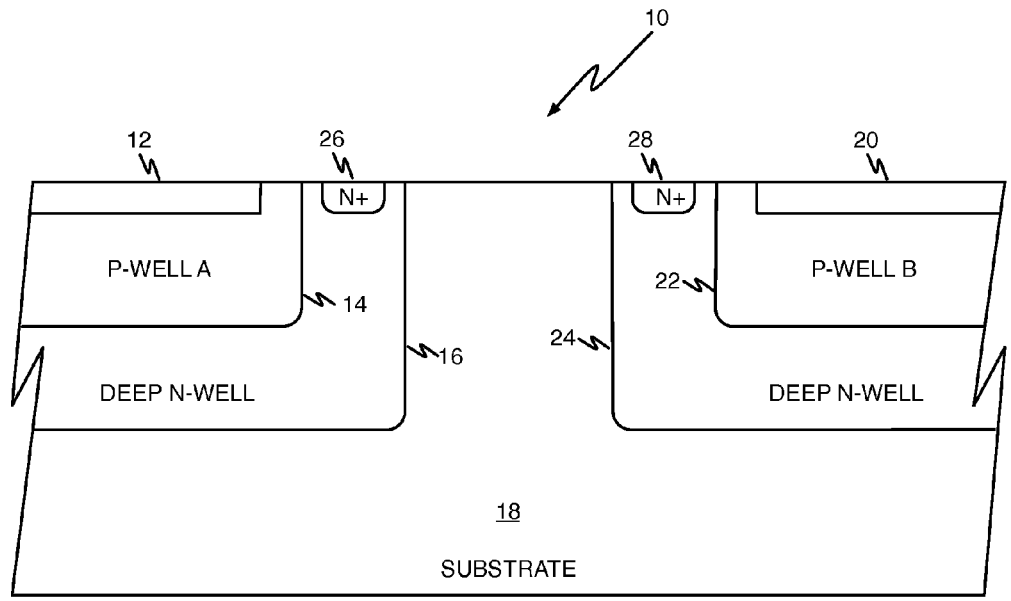
FIG. 1 is a cross-sectional view of a portion of an integrated circuit showing an isolation scheme for static and dynamic partial programming of an FPGA device according to one aspect of the present invention.

Referring first to FIG. 1, a cross-sectional view of a portion 10 of an integrated circuit shows an isolation scheme for static and dynamic partial programming of a Flash-based FPGA device according to one aspect of the present invention. The isolation scheme shown in FIG. 1 permits partial programming of FPGA integrated circuits and includes a first segment 12 of Flash memory in a first p-well 14 disposed in a first deep n-well 16 in a p-type semiconductor region 18 that may be a substrate or well.

A second segment of Flash memory 20 is disposed in a second p-well 22 in the semiconductor region 18. The second p-well 22 is disposed in a second deep n-well 24 in the semiconductor region 18 that is spaced apart from the first deep n-well 16. An n-type region (26 and 28) is disposed in each deep n-well between the outer boundary of the p-well containing the Flash memory segment and the outer boundary of the deep n-well. The n-type region (26 and 28) has a dopant concentration higher than that of the deep n-well in which it is contained.

Figure 2:
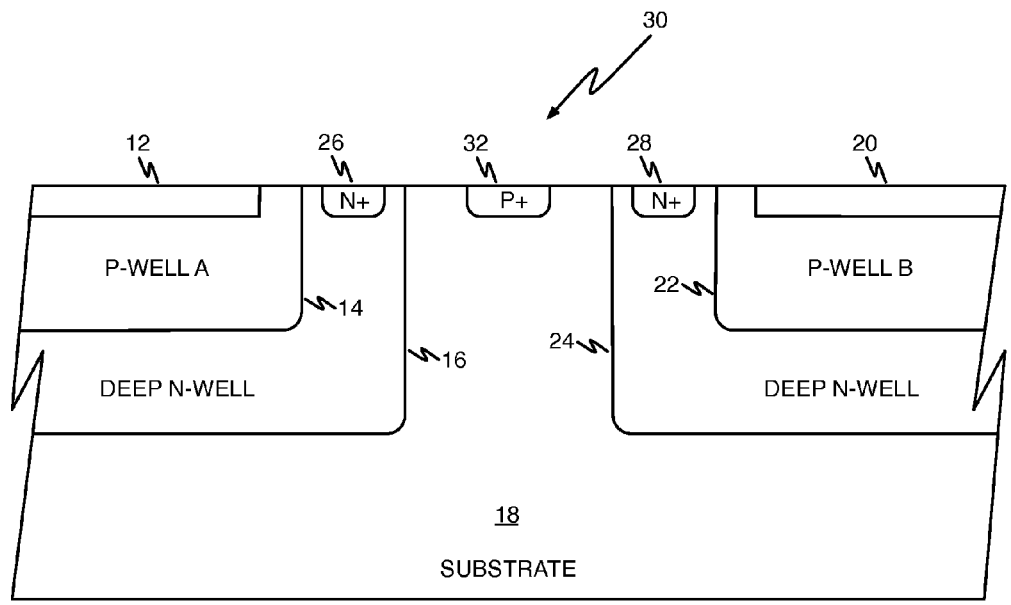
FIG. 2 is a cross-sectional view of a portion of an integrated circuit showing an isolation scheme for static and dynamic partial programming of an FPGA device according to another aspect of the present invention.

Referring now to FIG. 2, a cross-sectional view of a portion 30 of an integrated circuit shows another isolation scheme for static and dynamic partial programming of a Flash-based FPGA device according to an aspect of the present invention. The isolation scheme shown in FIG. 2 also permits partial programming of FPGA integrated circuits. Elements depicted in FIG. 2 that are also present in FIG. 1 are designated using the same reference numerals used in FIG. 1 for the same elements.

The isolation scheme shown in FIG. 2 includes a first segment 12 of Flash memory in a first p-well 14 disposed in a first deep n-well 16 in a p-type semiconductor region 18. A second segment of Flash memory 20 is disposed in a second p-well 22 in the semiconductor region 18. The second p-well 22 is disposed in a second deep n-well 24 in the semiconductor region 18 that is spaced apart from the first deep n-well 16.

An n-type region (26 and 28) is disposed in each deep n-well between the outer boundary of the p-well containing the Flash memory segment and the outer boundary of the deep n-well. The n-type region (26 and 28) has a dopant concentration higher than that of the deep n-well in which it is contained. In addition to the scheme depicted in FIG. 1, the isolation scheme depicted in FIG. 2 includes a p-type region 32 disposed in the semiconductor region 18 between the deep n-wells 16 and 24 having a dopant concentration higher than that of the p-type semiconductor region 18.

Figure 3:
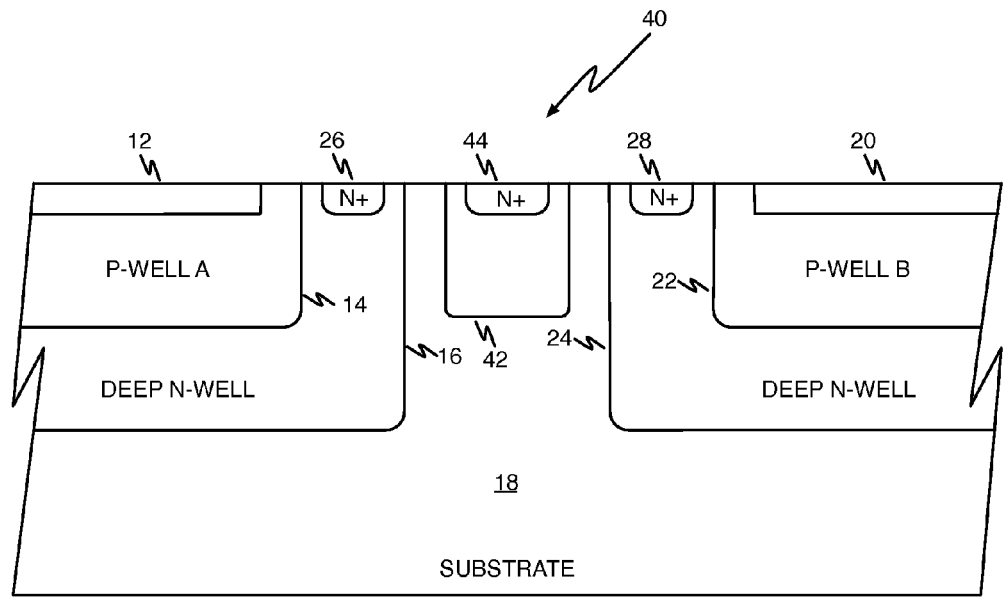
FIG. 3 is a cross-sectional view of a portion of an integrated circuit showing an isolation scheme for static and dynamic partial programming of an FPGA device according to another aspect of the present invention.

Referring now to FIG. 3, a cross-sectional view of a portion 40 of an integrated circuit shows a further isolation scheme for static and dynamic partial programming of a Flash-based FPGA device according to an aspect of the present invention. The isolation scheme shown in FIG. 3 also permits partial programming of FPGA integrated circuits. Elements depicted in FIG. 3 that are also present in FIG. 1 are designated using the same reference numerals used in FIG. 1 for the same elements.

The isolation scheme shown in FIG. 3 includes a first segment 12 of Flash memory in a first p-well 14 disposed in a first deep n-well 16 in a p-type semiconductor region 18. A second segment of Flash memory 20 is disposed in a second p-well 22 in the semiconductor region 18. The second p-well 22 is disposed in a second deep n-well 24 in the semiconductor region 18 that is spaced apart from the first deep n-well 16.

An n-type region (26 and 28) is disposed in each deep n-well between the outer boundary of the p-well containing the Flash memory segment and the outer boundary of the deep n-well. The n-type region (26 and 28) has a dopant concentration higher than that of the deep n-well in which it is contained. In addition to the scheme depicted in FIG. 1, the isolation scheme depicted in FIG. 3 includes an n-well 42 disposed in the semiconductor region 18 between the deep n-wells 16 and 24. An n-type region 44 is disposed in the n-well 42 and has a dopant concentration higher than that of the n-well 42.

Figure 4:
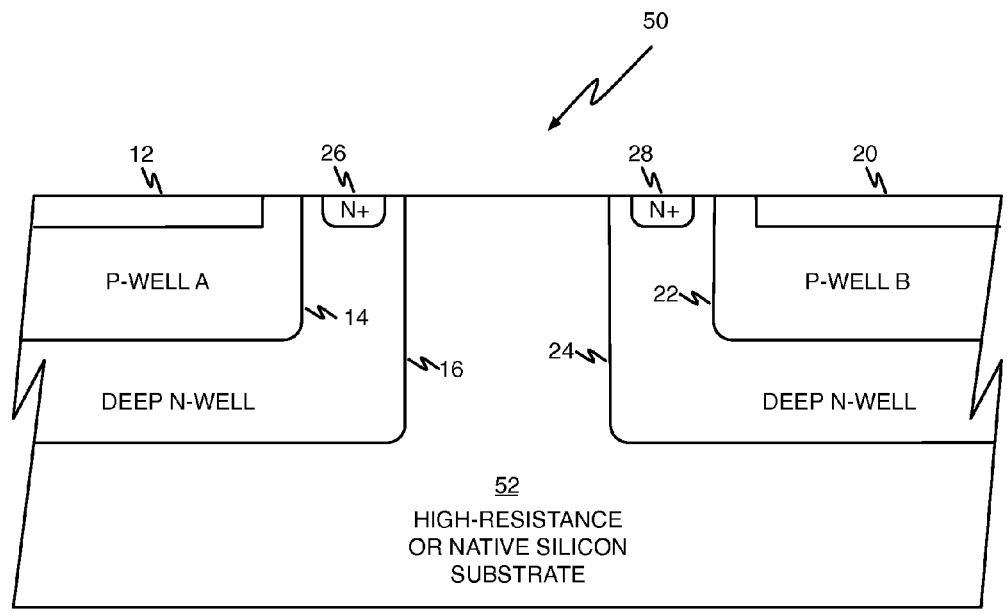
FIG. 4 is a cross-sectional view of a portion of an integrated circuit showing an isolation scheme for static and dynamic partial programming of an FPGA device according to another aspect of the present invention.

Referring now to FIG. 4, a cross-sectional view of a portion 50 of an integrated circuit shows a further isolation scheme for static and dynamic partial programming of a Flash-based FPGA device according to an aspect of the present invention. The isolation scheme shown in FIG. 4 also permits partial programming of FPGA integrated circuits. Elements depicted in FIG. 4 that are also present in FIG. 1 are designated using the same reference numerals used in FIG. 1 for the same elements.

The isolation scheme shown in FIG. 4 includes a first segment 12 of Flash memory in a first p-well 14 disposed in a first deep n-well 16 in a semiconductor region 52 that may be formed from a high-resistance p-type semiconductor material or a native (undoped) semiconductor material.

A second segment of Flash memory 20 is disposed in a second p-well 22 in the semiconductor region 52. The second p-well 22 is disposed in a second deep n-well 24 in the semiconductor region 52 that is spaced apart from the first deep n-well 16. An n-type region (26 and 28) is disposed in each deep n-well between the outer boundary of the p-well containing the Flash memory segment and the outer boundary of the deep n-well. The n-type region (26 and 28) has a dopant concentration higher than that of the deep n-well in which it is contained.

In the various embodiments of the present invention disclosed herein, exemplary doping concentrations for the n-well regions are from about 1E15 to about 8E17, with a doping depth of from about 0.8 um to about 2 um. Deep n-well doping concentrations are from about 1E15 to about 2E17, with depths of from about 1.5 um to about 3 um. For the p-wells in the triple well structures, the doping concentrations range from about 1E15 to about 1E18 and the doping depths range from about 0.8 um to about 2 um.

Employing the isolation schemes of the present invention allows segments of the Flash memory in the FPGA while other sectors or segments are uninterrupted and remain operational. This requires that any sensing or charge pump circuitry used to partially program any segment of Flash memory in the FPGA be isolated from sensing or charge pump circuitry associated with the other segments of the Flash memory that are not to be programmed.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An isolation scheme to permit partial programming of FPGA integrated circuits controlled by Flash memory cells including:

a p-type semiconductor region;

a first deep n-well disposed in the p-type semiconductor region and having an outer boundary;

a second deep n-well disposed in the p-type semiconductor region and having an outer boundary, the second deep n-well separated from the first deep n-well region;

a first p-well disposed in the first deep n-well and having an outer boundary;

a second p-well disposed in the second deep n-well and having an outer boundary;

a first segment of Flash memory disposed in the in first p-well;

a second segment of Flash memory disposed in the second p-well;

a first n-type region disposed in the first deep n-well between the outer boundary of the first p-well the outer boundary of the first deep n-well, the first n-type region having a dopant concentration higher than that of the first deep n-well;

a second n-type region disposed in the second deep n-well between the outer boundary of the second p-well the outer boundary of the second deep n-well, the second n-type region having a dopant concentration higher than that of the second deep n-well.

2. The isolation scheme of claim 1 wherein the p-type semiconductor region is a semiconductor substrate.

3. The isolation scheme of claim 1, further including a p-type region having a dopant concentration higher than that of the p-type semiconductor region disposed between and separated from the first and second deep n-wells.

4. The isolation scheme of claim 3 wherein the p-type semiconductor region is a semiconductor substrate.

5. The isolation scheme of claim 1, further including:
   an isolation n-well disposed in the p-type semiconductor region at a location between and separated from the first and second deep n-wells; and
   an n-type region disposed in the isolation n-well and having a dopant concentration higher than that of the isolation n-well.

6. The isolation scheme of claim 5 wherein the p-type semiconductor region is a semiconductor substrate.

7. The isolation scheme of claim 1 wherein the p-type semiconductor region is a high-resistance p-type semiconductor substrate.

8. The isolation scheme of claim 1 wherein the p-type semiconductor region is a native silicon semiconductor substrate.

* * * * *